(12) United States Patent
Doi et al.

(10) Patent No.: US 8,000,200 B2
(45) Date of Patent: Aug. 16, 2011

(54) HFM ENABLE CONTROL SYSTEM

(75) Inventors: Akihiko Doi, Tokyo (JP); Shengyuan Li, Dallas, TX (US); Lundy Findlay Taylor, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 65 days.

(21) Appl. No.: 12/639,753

(22) Filed: Dec. 16, 2009

(65) Prior Publication Data

US 2010/0315926 A1    Dec. 16, 2010

Related U.S. Application Data

(60) Provisional application No. 61/186,208, filed on Jun. 11, 2009, provisional application No. 61/186,303, filed on Jun. 11, 2009, provisional application No. 61/186,184, filed on Jun. 11, 2009.

(51) Int. Cl.
*G11B 7/00* (2006.01)
(52) U.S. Cl. ............... 369/59.19; 369/59.1; 369/47.1; 369/124.01; 369/116

(58) Field of Classification Search ................. None
See application file for complete search history.

(56) References Cited

U.S. PATENT DOCUMENTS

| | | | |
|---|---|---|---|
| 5,777,967 A * | 7/1998 | Ishibashi et al. | 369/59.2 |
| 7,221,629 B2 * | 5/2007 | Hayashi et al. | 369/47.22 |
| 7,791,385 B2 * | 9/2010 | Huang et al. | 327/160 |

* cited by examiner

*Primary Examiner* — Muhammad N Edun
(74) *Attorney, Agent, or Firm* — Dawn V. Stephens; Wade James Brady, III; Frederick J. Telecky, Jr.

(57) ABSTRACT

A modulation control system for use with a high frequency modulator is described. This system comprises a latch for selectively receiving enable signals, wherein the latch transmits a latched signal in response to receiving at least two of the enable signals; a selection device coupled to the latch for receiving the latched signal, a voltage source, and a terminal for receiving at least one of the enable signals, wherein the selection device transmits a selected signal; and a logic device coupled to the selection device and a terminal for receiving a modulated enable signal, wherein the logic device transmits a synchronized signal for either enabling or disabling the high frequency modulator in response to receiving the selected signal associated with at least one of the enable signals.

14 Claims, 6 Drawing Sheets

HFM ENABLE CONTROL SYSTEM

CROSS REFERENCE TO RELATED APPLICATION(S)

The present application claims priority to jointly owned U.S. Provisional Application corresponding to application No. 61/186,208 entitled, "Dynamic High Frequency Modulator Control System." This provisional application was filed on Jun. 11, 2009. The present application also claims priority to jointly owned U.S. Provisional Application corresponding to application No. 61/186,303 entitled, "High Frequency Enable Control System." This provisional application was filed on Jun. 11, 2009. Finally, this present application claims priority to jointly owned U.S. Provisional Application corresponding to application No. 61/186,184 entitled, "Channel Input Current Device." This provisional application was filed on Jun. 11, 2009.

DESCRIPTION OF RELATED ART

With the evolution of electronic devices, there is a continual demand for enhanced speed, capacity and efficiency in various areas including electronic data storage. Motivators for this evolution may be the increasing interest in video (e.g., movies, family videos), audio (e.g., songs, books), and images (e.g., pictures). Optical disk drives have emerged as one viable solution for supplying removable high capacity storage. When these drives include light sources, signals sent to these sources should be properly processed to reduce potential damage in appropriate light emission.

BRIEF DESCRIPTION OF THE DRAWINGS

The high frequency modulator control system may be better understood with reference to the following figures. The components within the figures are not necessarily to scale, emphasis instead being placed upon clearly illustrating the principles of the invention. Moreover, in the figures, like reference numerals designate corresponding parts or blocks throughout the different views.

Figure 1A:
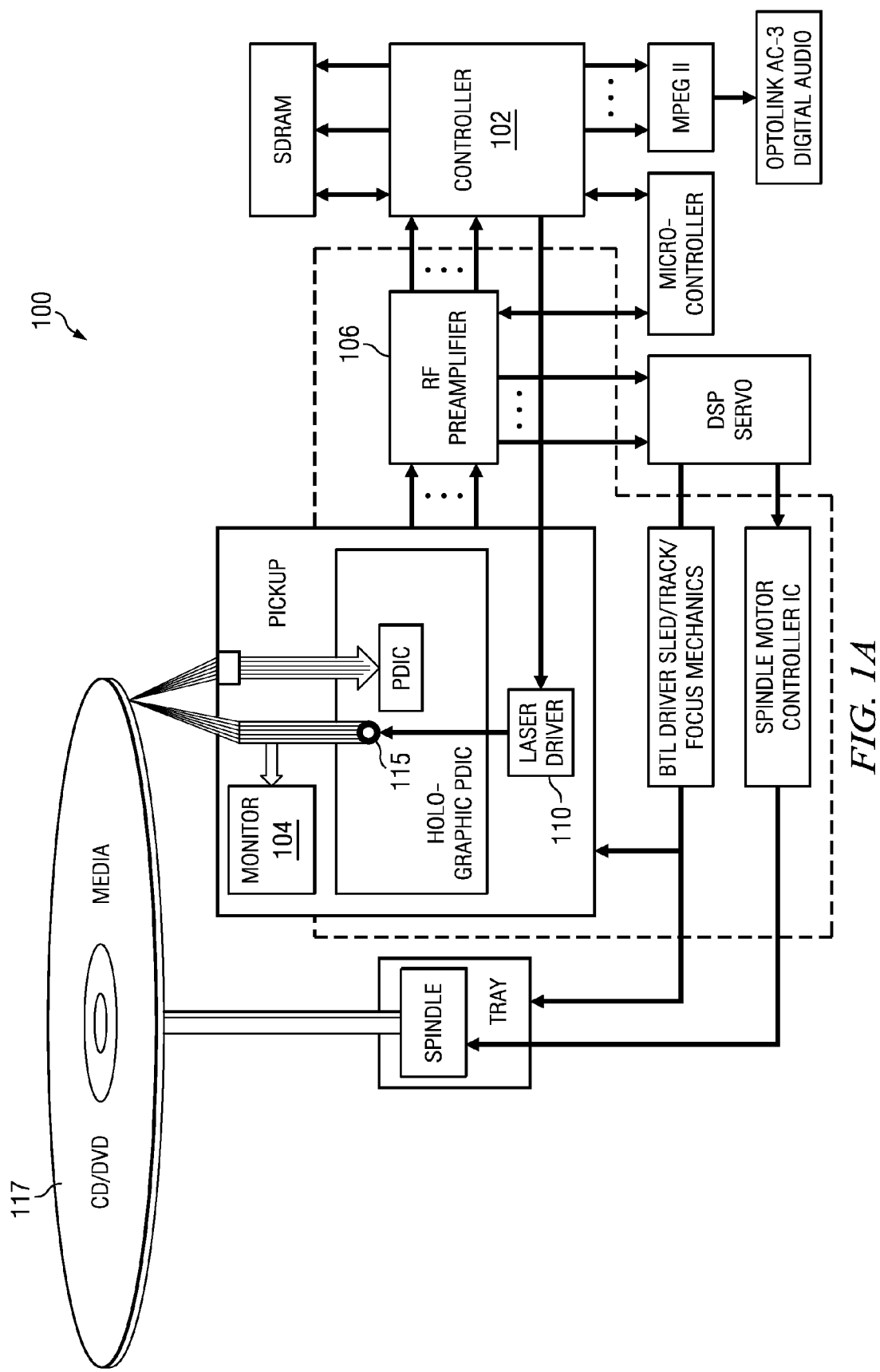
FIG. 1A, is a system drawing illustrating components within an optical disk drive.

While the high frequency modulator control system is susceptible to various modifications and alternative forms, specific embodiments have been shown by way of example in the drawings and subsequently are described in detail. It should be understood, however, that the description herein of specific embodiments is not intended to limit the high frequency modulator control system to the particular forms disclosed. In contrast, the intention is to cover all modifications, equivalents, and alternatives falling within the spirit and scope of the high frequency modulator control system as defined by this document.

DETAILED DESCRIPTION OF EMBODIMENTS

As used in the specification and the appended claim(s), the singular forms "a," "an" and "the" include plural referents unless the context clearly dictates otherwise. Similarly, "optional" or "optionally" means that the subsequently described event or circumstance may or may not occur, and that the description includes instances where the event or circumstance occurs and instances where it does not.

Turning now to FIG. 1A, is a system drawing illustrating components within an optical disk drive 100. A controller 102 monitors the output light power level of a laser diode 115 using a Monitor PD 104, or monitor photodiode, and an RF, or radio frequency, preamplifier 106. This controller can keep an expected power level by changing an input control current of a laser driver 110 through an APC, or auto power controlling, feedback loop, even if a light source 115 such as a laser diode, has many changes of the output power due to various condition changes, such as temperature etc.

Also, the controller 102 sets the enable signal for switching some current channels of the laser driver 110, which arranges a data writing pulse. In the case of data reading, the controller 102 may only set the DC current by disabling the switching and applying the indicated input current. In the case of data writing, the controller 102 applies some adjustment signals, or enable-switching signals, to arrange the writing pulse waveform as a combination of switching timing, which also changes the power level by different indicated current of each channel. The controller 102 can arrange these indicated currents based on the Monitor PD 104 output with some detecting function in the RF preamplifier 106. At the very least, this controller has two controlling levels for the reading power and the writing power. Sometimes the controller may get the top, bottom, or average level of a writing pulse and calculate to control some power levels independently.

As illustrated in this figure, the laser driver 110 sends a signal that prompts an associated light source 115 (e.g., laser diode) to emit light. The light source 115 may emit light at any of a number of wavelengths (e.g., 400 nm, 650 nm, 780 nm). Light from this source contacts an associated optical media 117, such as a compact disc (CD), blue ray device (Blu-ray), or digital versatile disk (DVD). Light contacting the optical media can either facilitate data storage or data retrieval from the optical media 117.

Figure 1B:
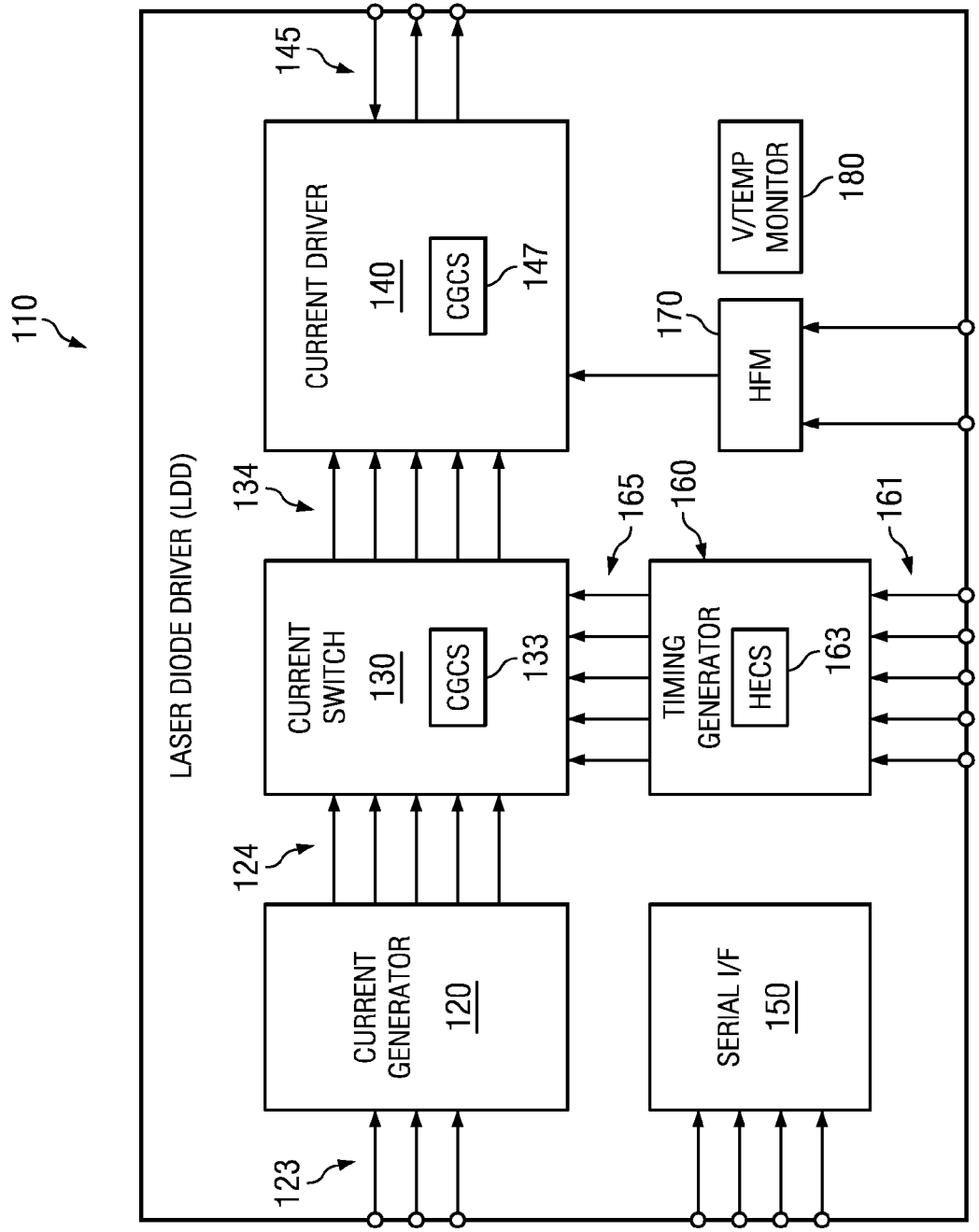
FIG. 1B is an environmental drawing including a laser diode driver current input signal processing system.

FIG. 1B is an enlarged view of the innovative laser driver 110, which may be a laser diode drive (LDD). The LDD 110 is an integrated, fully programmable, multi-function product that controls and drives laser diodes (e.g., light source 115) within optical drives as described with reference to FIG. 1A. More specifically, the LDD 110 can apply the current for the read, write, and erase removable high capacity disks (e.g., capacities greater than approximately 50 Gbytes/disk). The LDD 110 also has low noise (e.g., noise of approximately 0.5 nA/rt-Hz), high speed (e.g., 1 Gb/s, 0.850 Gb/s) and high current (e.g., approximately 1 amp). Any numbers included in this application are for illustrative purposes only and numerous alternative implementations may result from selecting different quantitative values.

At a high level, the LDD 110 may include a current generator 120. Generally, the current generator 120 receives some input signals 123 associated with several input channels, which have an associated input current. This current generator 120 works in tandem with a current driver 140 and produces a gain for the input current. As a result, the current generator 120 and current driver 140 control the amount of current for each output channel 145. For the input signals that the current generator 120 receives, it transmits output signals that a current switch 130 receives. The current switch 130 decides which of the input channels should be turned on or turned off. For the channels that should be turned on, the current switch 130 makes those channels active. Similarly, the current switch 130 inactivates the channels that should be turned off and transmits output signals reflecting this change. The current driver 140 receives these output signals from the current switch 130 as input signals. The current driver 140 is the last current gain stage and drives the laser diodes directly. In other words, the output signals from the current driver 140 also serve as output signals for the LDD 110, which are used in driving the lasers, or the light source 115 (see FIG. 1A).

In addition to the above-mentioned devices, the LDD 110 includes additional components. A serial interface (I/F) 150 has several inputs 155 (e.g., serial data enable, serial data, serial clock) that may be used for an enable, feature selection, or setting the gain. Like the serial interface 150, the timing generator 160 receives various channel enable inputs 165. Though there are five channel enable inputs that are shown in FIG. 1B, the LDD 110 may have any number of channel enable inputs, such as two, six, or the like. The timing generator 160 determines the time at which a given input channel will be either turned on or turned off. The LDD 110 also includes a high frequency modulator (HFM) 170 and voltage/temperature monitor (V/Temp Monitor) 180. The HFM 170 modulates the output current for reducing mode-hopping noise of the laser diodes. The voltage/temperature monitor 190 monitors the laser diode voltage drop and on-chip temperature. One skilled in the art will appreciate that numerous alternative implementations may result from removing any or several of the blocks within the LDD 110.

The HFM enable control system (HECS) 163, which is shown as a part of the timing generator 160 in FIG. 1B, can either enable or disable HFM 170 using the enable signals 161. The timing generator 160 transmits enable signals 165, which includes an enable/disable control of the HFM 170. Using the HECS 170 may substantially reduce timing delays associated with receiving the switched signals 124 and the enable signals 165. System variations such as temperature changes, voltage source changes, and the like may create even greater timing delays that the HECS 163 helps reduce. In an alternative implementation, this HECS may be included in a different block, such as HFM 170.

When writing data on various types of optical media like the disk 117, the LDD 110 may use different pulse shapes, which may mean turning on different channels at different times. For example, one could write to one type of disk using a mono pulse current signal, while one could write to another type of disk using a pulse wave modulated (PWM) current signal. These pulse shapes may be made by switching several channels of current and summing them.

Figure 2A:
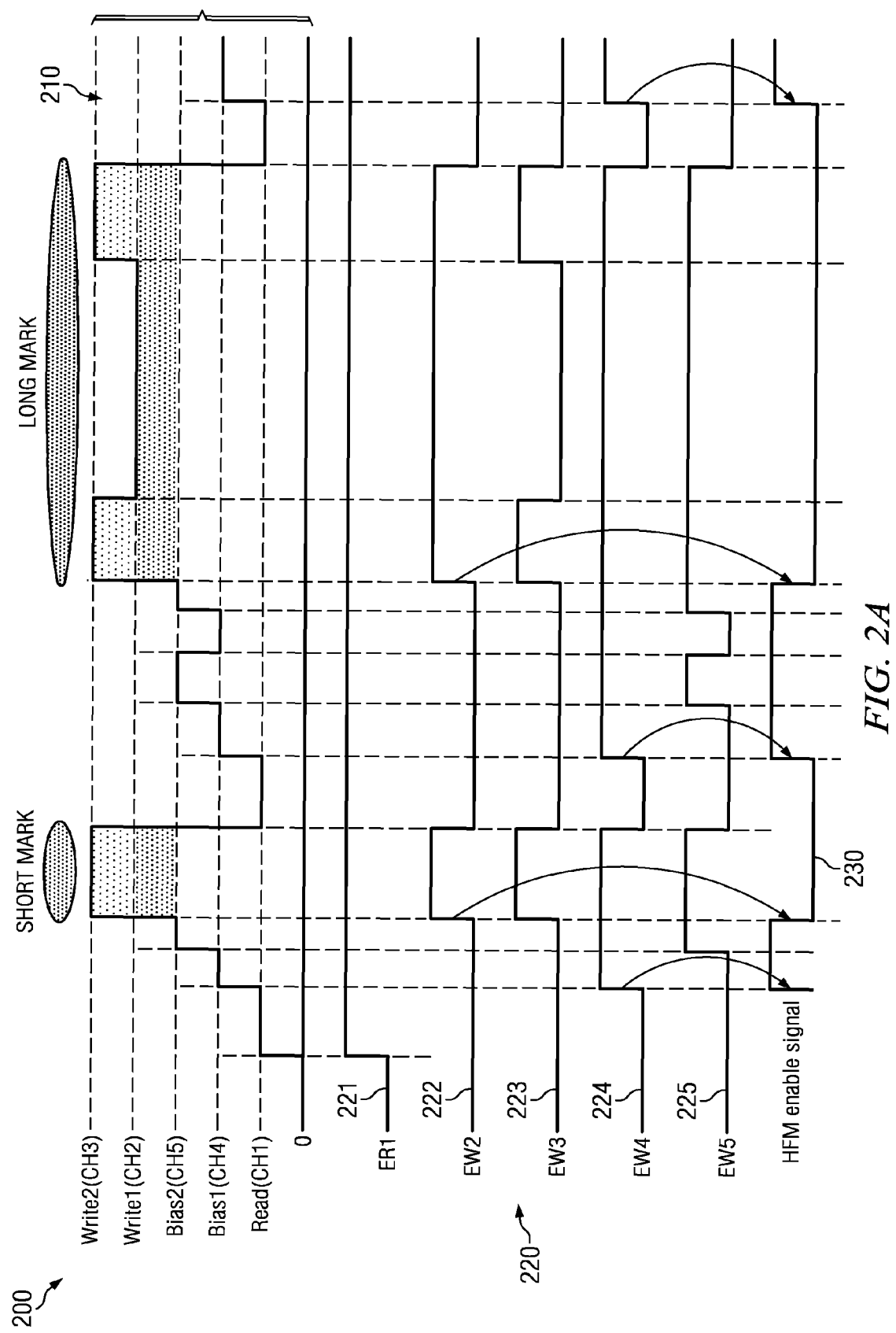
FIG. 2A is a graph illustrating how the output current varies with the current on individual enable channels for the enable signals and an HFM enable for a Mono pulse shape.

FIG. 2A is a graph illustrating how the output current varies with the current on individual enable channels for the enable signals 161 and an HFM enable for a Mono pulse shape. The output current signal 210 has values of read current enabled by ER1 221, a first bias current enabled by EW4 224, a second bias current enabled by EW5 224, a first write current enabled by EW2 222, and a second write current enabled by EW3 223. However an alternative implementation may have only one bias current, for example. In this implementation, there are five enable channels 220, though the HECS 163 is applicable to any number of enable channels, such as 3, 4, 7 or the like. Enable signal 222 may be the associated with the main write current channel for writing data. Enable signals 223, 224, and 225 may be associated with other current channels to obtain the combination of the current within a data period. Some examples of a data period may be 15.2 nS, 34.3 nS, or the like. In other words, depending on the type of disk and the read/write speed, the data period varies. Enable signal 223 may be for peak current for some portion of a write pulse; enable signal 224 may be for decreasing current at the end of a write pulse, such as short time cooling. This cooling may be beneficial because it will enable us to obtain better write marks. Enable signal 225 is for a PWM signal on the space (between writing data) area, which may be used for one type of disk. While this implementation only includes a single read enable signal 221, other implementations may include more than one read enable signal and consequently more than one read channel.

Signal 230 represents an HFM enable signal, such as the enable signal that the HECS 163 venerates and the timing generator 160 transmits to the current switch 130. The rising edge of the enable signal 224 to the rising edge of the enable signal 222 can set the timing for the HFM enable signal 230. Similarly, setting this HFM enable signal using the switching enable signals 222, 224 synchronizes the HFM enable signal 230 with data writing and minimizes the impact of propagation delay between the switch signals 124 and the enable signals 165. This may create a more robust LDD 110 that is less immune to propagation delays resulting from temperature increase or voltage source increases.

Figure 2B:
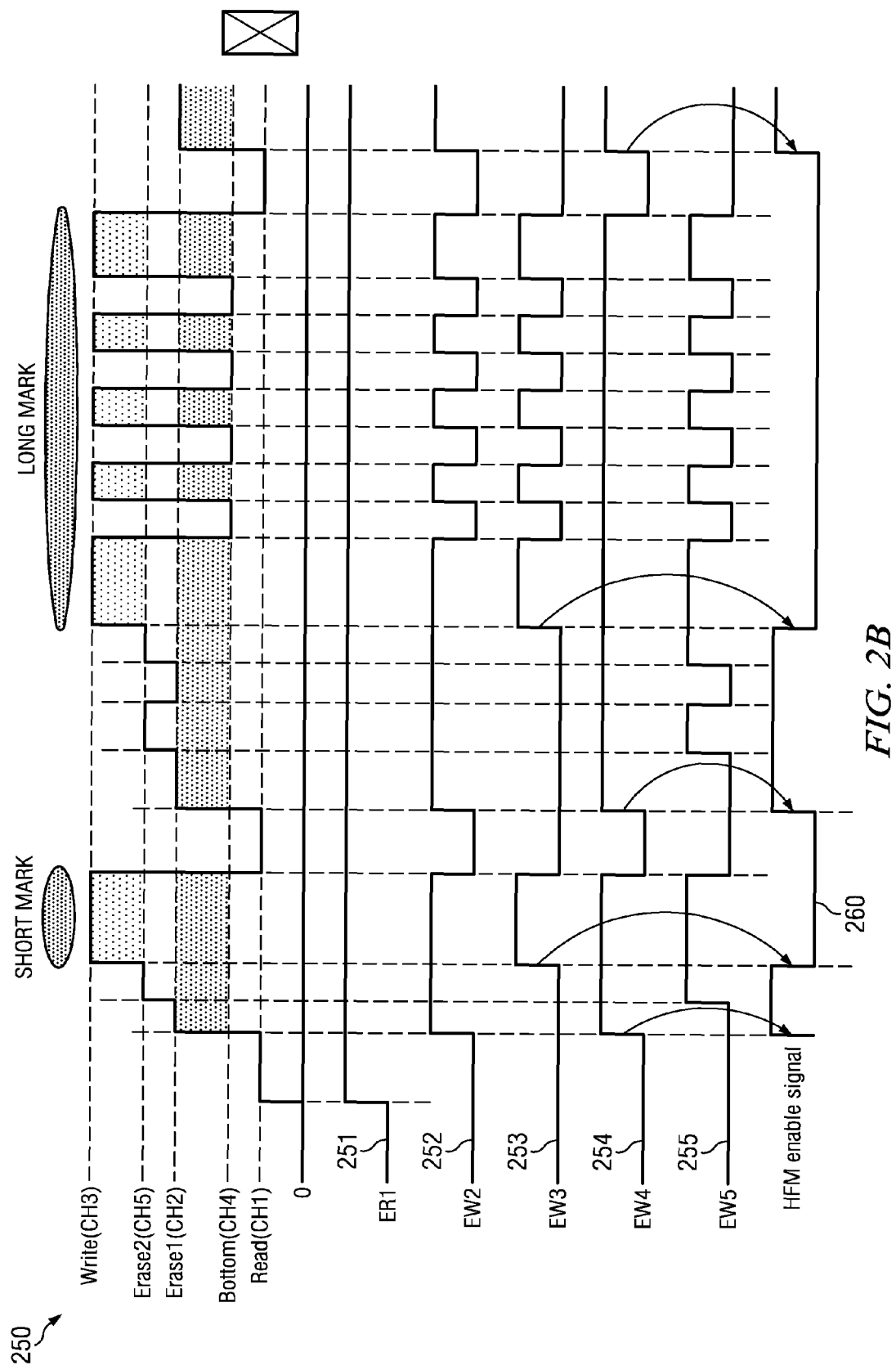
FIG. 2B is a graph illustrating how the output current varies with the current on individual enable channels and an HFM enable for a PWM pulse shape.

Turning now to FIG. 2B, this is a graph 250 illustrating how the output current varies with the current on individual enable channels and art HFM enable for a PWM pulse shape. Like the implementation described with reference to FIG. 2A, this implementation also has five current enable channels, though applicable with other numbers of input channels. For this implementation, enable signal 252 is associated with the first erase current for data writing; enable signal 253 is associated with main write current for data writing. Enable signal 254 is associated with bottom current for data writing and enable signal 255 is associated with the second erase current for data writing. Enable signal 254 is used to decrease current at the end of write pulse, such as during short time cooling. Enable signal 255 is a PWM signal on the space between writing data area. The rising edges of the enable signal 254 to the rising the rising edge of the signal 253 can set the timing for the HFM enable signal 260. This synchronizes the HFM enable signal 260 with write current enable signal 253 and 254. Therefore, it minimizes the impact of propagation delay between the write current switch enable signals and the HFM enable signal.

Figure 3:
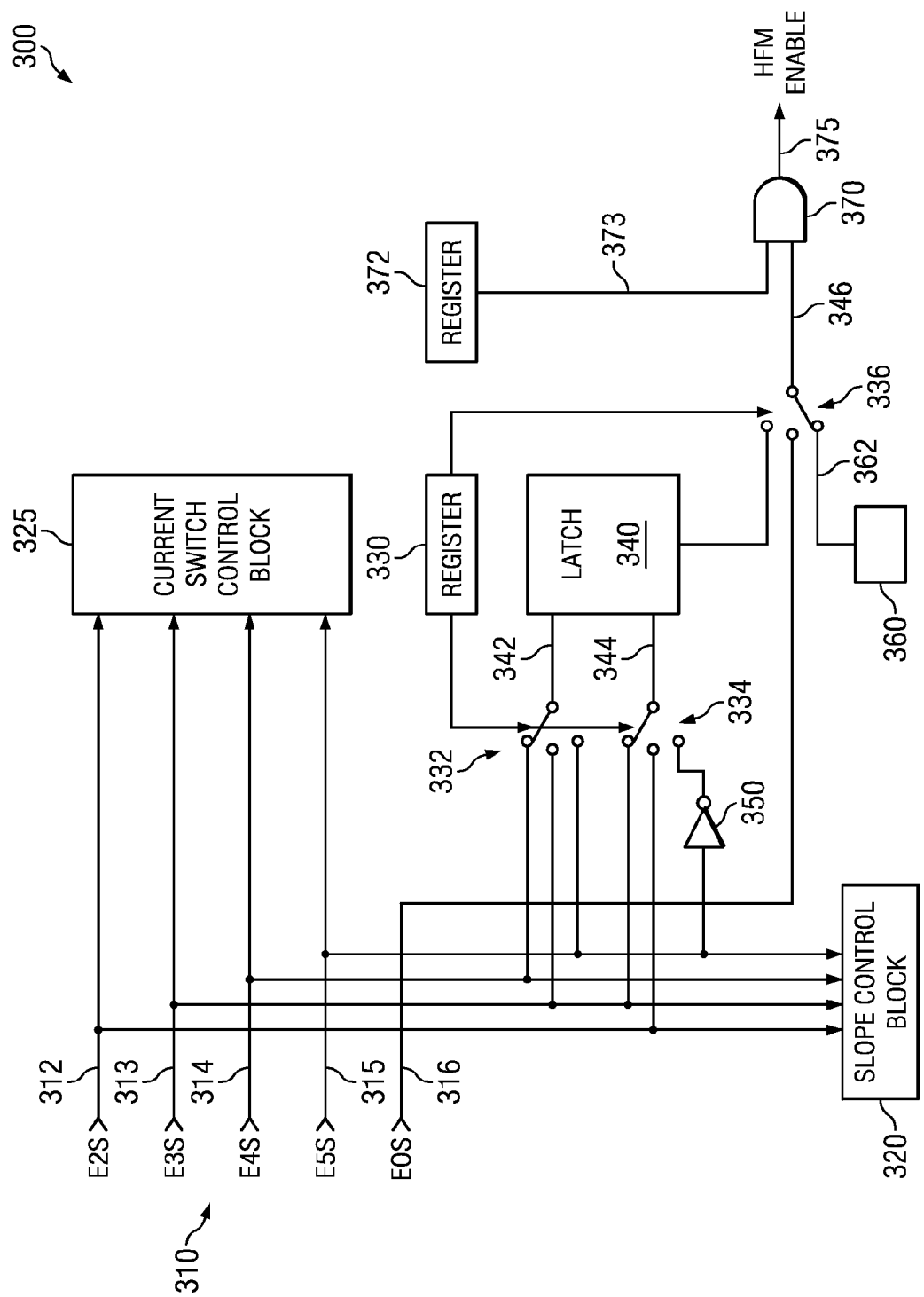
FIG. 3 illustrates a block diagram one implementation of the HECS of FIG. 1B.

FIG. 3 illustrates a block diagram 300 one implementation of the HECS 163. In this implementation, there are five enable signals 310, which may correspond to the enable signals 161. Enable current channels 312-315 may be routed to a slope control block 320 and a current switch control block 325. The slope control block 320 may be used for channel skew control. The current switch control block 325 may be used for output current control. A register 330 controls three selection devices, such as switch 332, switch 334, and switch 336. An alternative implementation may include a different number of selection devices or different types of sections devices such as a CMOS switch or transmission gate. In one implementation this register may be a 1-bit, 2-bit, 3-bit, or 4-bit register, or some other suitable number bit register. In one example, the register 330 is 3-bit and is defined as follows:

| Value | Definition |
| --- | --- |
| 000 | Enable/disable by modulation enable signal 316 |
| 001 | Enable by 314 rise edge, disable by 312 rise edge |

-continued

| Value | Definition |
|---|---|
| 010 | Enable by 314 rise edge, disable by 313 rise edge |
| 011 | Enable by 315 rise edge, disable by 312 rise edge |
| 100 | Enable by 315 rise edge, disable by 312 rise edge |
| 101 | Enable by 313 rise edge, disable by 312 rise edge |
| 110 | Enable by 315 rise edge, disable by 315 fall edge |
| 111 | Enable all the time |

The switch 332 and switch 334 receives the enable signals 312-315. In contrast, the enable signal 316 goes directly to the switch 336; this enable signal may differ from the other enable signals in that it may have different propagation delay etc. A latch 340 connects to the switches 332-336. In one implementation, this latch may be a SR latch, such as a NAND based latch. The switch 332 transmits a switched signal to the larch 340 using the terminal 342, which may be an enable terminal for the latch 340.

In contrast, the switch 334 transmits a switched signal to the latch 340 using the terminal 344, which may be a disable terminal for the latch 340. A logic device 350 also alters the enable signal for the channel 315 before transmitting this signal to the switch 334. In this implementation, the logic device 350 is an inverter, though other types of logic devices are equally applicable.

The switch 336 and the logic device 370 cooperatively transmit an HFM enable signal on the terminal 375. A voltage source 360 may apply a voltage to the terminal 362 of the switch 366. In one implementation, this voltage source may be a constant high voltage source, such as the supply voltage. The switch 336 transmits a switched signal to the logic device 370 using the terminal 346. While the logic device 370 is shown as an AND gate, alternative implementations may result from using different kinds of logic devices, such as a NAND gate. The register 372 connects to the logic device 370 using the terminal 373. This register may hold a modulated enable signal darting from the digital core.

HFM enable signal can be controlled by either modulation enable signal EOS itself, or on all the time ("HIGH"), or the channel enable signals' edges. Here, the Channels 2, 3, 4, 5 enable signals are E2S, E3S, E4S, E5S respectively. They are selected by a 3-bit register HFM_CNT to generate A-signal which controls the enable of HFM and B-signal and controls the disable of HFM.

Figure 4:
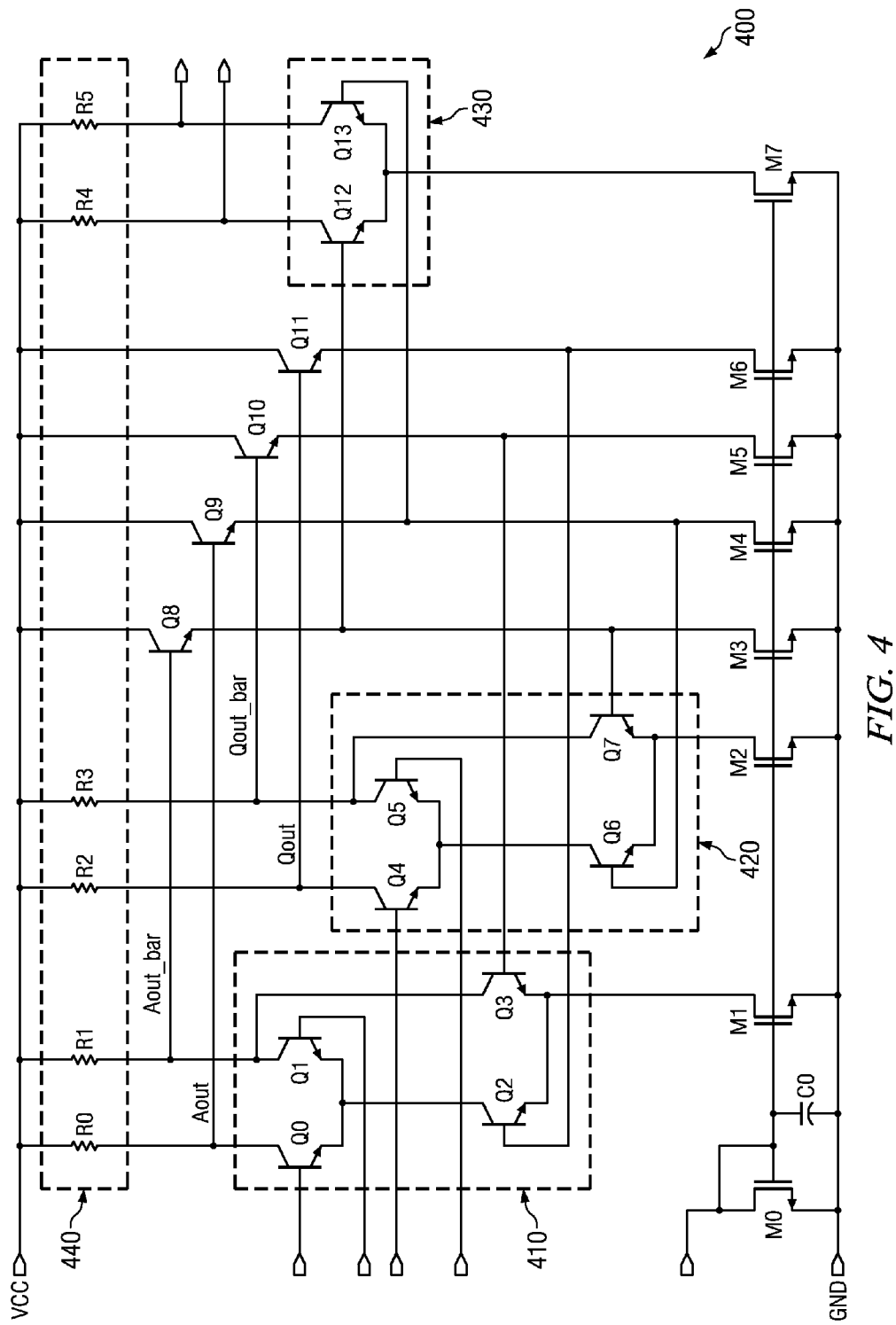
FIG. 4 illustrates a circuit diagram of one implementation of the latch of FIG. 3.

FIG. 4 illustrates a circuit diagram 400 of one implementation of the latch 340. This circuit diagram includes a first logic a first logic gate 410 made up of devices Q0-Q3 and a second logic gate 420 made up of devices Q4-Q7. In one implementation, these logic devices may be an emitter coupled logic (ECL) AND logic gates. The circuit diagram also includes an output buffer 430 made up of devices Q12-Q13; in one implementation, this output buffer may be ECL output buffer. A resistive load 440 made be made up of devices R0-R5 are the balanced resistive load for three logic devices 410-430. Devices M0-M7 are biasing current sources, while device C0 is for bypassing. Devices Q8-Q9 and devices Q10-Q11 are two emitter followers. Numerous alternative implementations may result from changing either the number or types of transistors without departing from the concepts herein.

The HECS 163 can either enable or disable the HFM output by synchronizing with data writing. Consequently, the HFM 170 can be turned off during a data writing period. To generate the timing for High Frequency Modulation (HFM) enable control system as the same timing of writing data, this system has a selector to set the edge tinting from channel switching enable signals.

While various embodiments of the high frequency modulator control system have been described, it may be apparent to those of ordinary skill in the art that many more embodiments and implementations are possible that are within the scope of this system. Although certain aspects of the high frequency modulator control system may be described in relation to specific techniques or structures, the teachings and principles of the present system are not limited solely to such examples. All such modifications are intended to be included within the scope of this disclosure and the present high frequency modulator control system and protected by the following claim(s).

The invention claimed is:

1. A modulation control system for use with a high frequency modulator, comprising:
    a latch for selectively receiving enable signals, wherein the latch transmits a latched signal in response to receiving at least two of the enable signals;
    a selection device coupled to the latch for receiving the latched signal, a voltage source, and a terminal for receiving at least one of the enable signals, wherein the selection device transmits a selected signal; and
    a logic device coupled to the selection device and a terminal for receiving a modulated enable signal,
    wherein the logic device transmits a synchronized signal for either enabling or disabling the high frequency modulator in response to receiving the selected signal associated with at least one of the enable signals.

2. The high frequency modulator enable control system of claim 1, further comprising first and second switches coupled to the latch, wherein each of the switches selectively transmits at least one of the enable signals to the latch.

3. The modulation control system of claim 1, the selection device is a third switch coupled to the logic device for selectively transmitting the selected signal.

4. The modulation control system of claim 3, further comprising a constant voltage source coupled to the third switch.

5. The modulation control system of claim 1, wherein the high frequency modulator is disabled during a writing period.

6. The modulation control system of claim 1, wherein the synchronized signal is set by edge timing from at least one of the enable signals.

7. A modulation control system for use with a high frequency modulator, comprising:
    first and second switches for receiving enable signals associated current enable channels, wherein the first and second switches respectively transmit first and second switched signals;
    a latch coupled to the switches for receiving the first and second switched signals, wherein the latch transmits a latched signal in response to receiving the first and second switched signals;
    a third switch coupled to the latch for receiving the latched signal, and a terminal for receiving at least one of the enable signals, wherein the third switch transmits a selected signal; and
    a logic device coupled to receive the selected signal, wherein the logic device transmits a synchronized signal for either enabling or disabling the high frequency modulator in response to receiving the selected signal.

8. The modulation control system of claim 7, further comprising a register that controls the operation of all of the switches.

9. The modulation control system of claim 7, further comprising a constant voltage source coupled to an input terminal of the third switch.

10. The modulation control system of claim 7, wherein the high frequency modulator is disabled during a writing period.

11. The modulation control system of claim 7, wherein the synchronized signal is set by edge timing from at least one of the enable signals.

12. An optical disk drive system, comprising:

a controller monitoring an output power lever of laser, diode and transmitting adjustment signals for varying the output power level;

a driver operatively coupled to the controller for receiving the adjustment signals, the laser driver having a current gain control system for independently altering gains associated with first and second input channels, comprising:

a latch for selectively receiving enable signals, wherein the latch transmits a latched signal in response to receiving at least two of the enable signals;

a selection device coupled to the latch for receiving the latched signal, a voltage source, and a terminal for receiving at least one of the enable signals, wherein the selection device transmits a selected signal; and a logic device coupled to the selection device and a terminal for receiving a modulated enable signal, wherein the logic device transmits a synchronized signal for either enabling or disabling the high frequency modulator in response to receiving the selected signal associated with at least one of the enable signals.

13. The optical disk drive system of claim 12, wherein the high frequency modulator is disabled during a writing period.

14. The optical disk drive system of claim 12, wherein the synchronized signal is set by edge timing from at least one of the enable signals.

* * * * *